(12) United States Patent
Lee

(10) Patent No.: US 11,348,941 B2
(45) Date of Patent: May 31, 2022

(54) MEMORY DEVICE AND METHOD OF FABRICATING THE SAME

(71) Applicant: MACRONIX International Co., Ltd., Hsinchu (TW)

(72) Inventor: Chih-Hsiung Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 71 days.

(21) Appl. No.: 16/856,285

(22) Filed: Apr. 23, 2020

(65) Prior Publication Data

US 2021/0335802 A1    Oct. 28, 2021

(51) Int. Cl.
*H01L 27/11582* (2017.01)
*H01L 29/423* (2006.01)
(Continued)

(52) U.S. Cl.
CPC .. *H01L 27/11582* (2013.01); *H01L 21/02532* (2013.01); *H01L 21/02595* (2013.01); *H01L 21/02636* (2013.01); *H01L 21/28525* (2013.01); *H01L 21/31111* (2013.01); *H01L 21/76802* (2013.01); *H01L 21/76877* (2013.01);
(Continued)

(58) Field of Classification Search
CPC .......... H01L 27/11582; H01L 29/4234; H01L 29/40117; H01L 21/76802; H01L 29/7926; H01L 29/66545; H01L 21/02636; H01L 21/28525; H01L 27/11565; H01L 21/31111; H01L 23/5226; H01L 21/76877; H01L 21/02532; H01L 21/02595;
(Continued)

(56) References Cited

U.S. PATENT DOCUMENTS

2016/0049423 A1*  2/2016  Yoo ................... H01L 27/11565
                                                           257/324
2016/0071869 A1*  3/2016  Lee ................... H01L 21/31116
                                                           257/314
(Continued)

FOREIGN PATENT DOCUMENTS

TW       201913967       4/2019
TW       201926575       7/2019
(Continued)

OTHER PUBLICATIONS

"Office Action of Taiwan Counterpart Application", dated Nov. 6, 2020, p. 1-p. 4.

*Primary Examiner* — Thanh T Nguyen
(74) *Attorney, Agent, or Firm* — J.C. Patents

(57) ABSTRACT

A memory device includes: first and second bit lines on a dielectric layer; first and second word lines between the first and second bit lines; a source line between the first and second word lines; a channel pillar penetrating through the first word line, the source line and the second word line, and connected to the first bit line, the source line, and the second bit line; a first charge storage structure surrounding a top surface and a bottom surface of the first word line and between a sidewall of the first word line and a lower portion of a sidewall of the channel pillar; and a second charge storage structure, surrounding a top surface and a bottom surface of the second word line and between a sidewall of the second word line and an upper portion of the sidewall of the channel pillar.

12 Claims, 14 Drawing Sheets

(51) Int. Cl.
    *H01L 21/311*     (2006.01)
    *H01L 21/02*     (2006.01)
    *H01L 29/66*     (2006.01)
    *H01L 21/28*     (2006.01)
    *H01L 21/285*     (2006.01)
    *H01L 21/768*     (2006.01)
    *H01L 27/11565*     (2017.01)
    *H01L 29/792*     (2006.01)
    *H01L 23/522*     (2006.01)
    *H01L 23/528*     (2006.01)
    *H01L 21/3105*     (2006.01)

(52) U.S. Cl.
    CPC ........ *H01L 23/528* (2013.01); *H01L 23/5226* (2013.01); *H01L 27/11565* (2013.01); *H01L 29/40117* (2019.08); *H01L 29/4234* (2013.01); *H01L 29/66545* (2013.01); *H01L 29/66833* (2013.01); *H01L 29/7926* (2013.01); *H01L 21/02164* (2013.01); *H01L 21/02271* (2013.01); *H01L 21/31053* (2013.01)

(58) Field of Classification Search
    CPC ............. H01L 23/528; H01L 29/66833; H01L 21/31053; H01L 21/02164; H01L 21/02271

See application file for complete search history.

(56) References Cited

U.S. PATENT DOCUMENTS

| | | | |
|---|---|---|---|
| 2017/0125433 | A1 | 5/2017 | Ogawa et al. |
| 2018/0158834 | A1 | 6/2018 | Ogawa et al. |
| 2019/0096898 | A1* | 3/2019 | Liu .................. H01L 27/11582 |
| 2019/0229125 | A1 | 7/2019 | Zhou et al. |
| 2021/0305273 | A1* | 9/2021 | Lee .................... H01L 21/0214 |

FOREIGN PATENT DOCUMENTS

| | | |
|---|---|---|
| TW | 201926868 | 7/2019 |
| TW | 202002177 | 1/2020 |
| TW | 202006888 | 2/2020 |
| TW | 202008567 | 2/2020 |
| TW | 202008568 | 2/2020 |

* cited by examiner

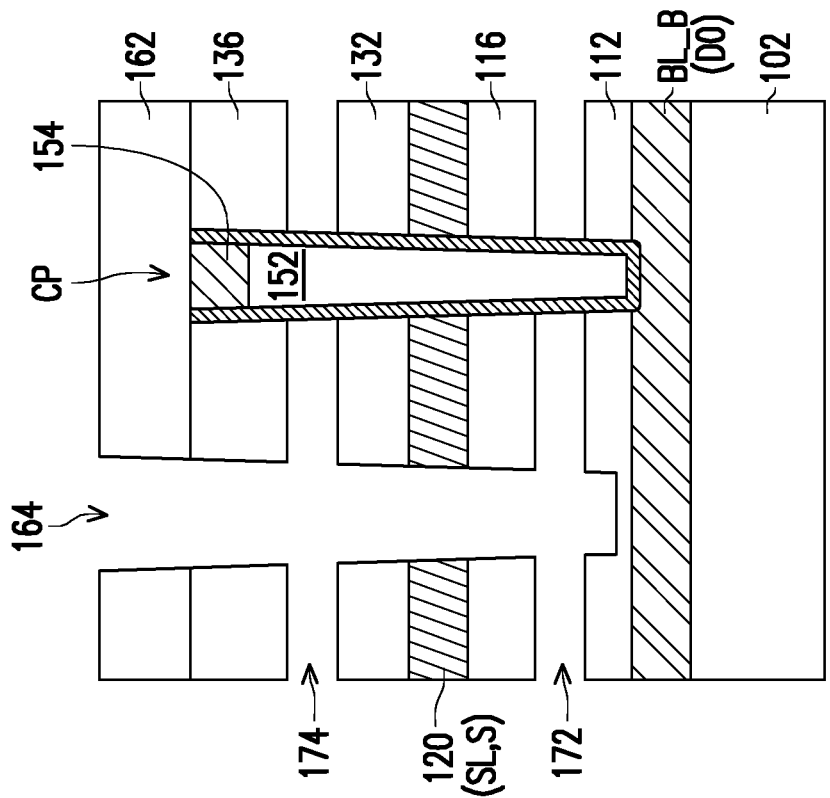
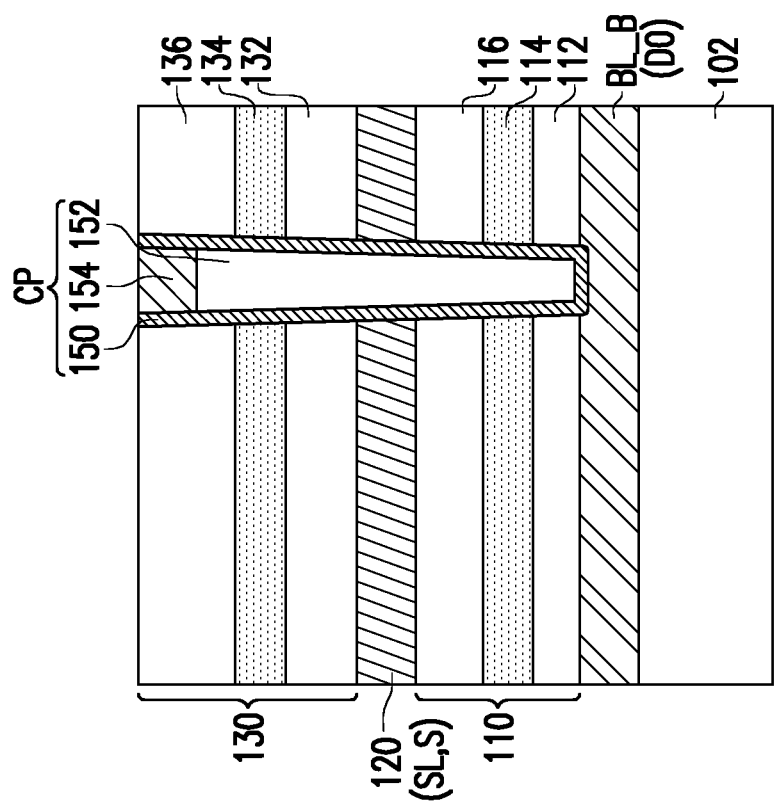
FIG. 3F
FIG. 3E

MEMORY DEVICE AND METHOD OF FABRICATING THE SAME

BACKGROUND

Technical Field

The invention relates to a memory device and a method of fabricating the same.

Description of Related Art

Along with rapid development of science and technology, advances of electronic components have increased the need for greater storage capacity. In order to meet the need of high storage density, sizes of memory devices become smaller and integration degrees thereof become higher. Therefore, patterns of the memory devices have evolved from a two-dimensional (2D) memory device with planar gate structures to three-dimensional (3D) memory devices with vertical channel (VC) structures. However, the 3D memory devices with the vertical channel structures still have many challenges.

SUMMARY

The invention is directed to a memory device and a method of fabricating the same, where the memory device has a plurality of memory cells stacked vertically in a unit area to effectively utilize an area of a substrate, and the method is compatible with existing processes.

An embodiment of the invention provides a memory device including at least one semiconductor layer located above a dielectric layer. The at least one semiconductor layer includes a first bit line and a second bit line, wherein the first bit line is located on the dielectric layer, and the second bit line is located above the first bit line; a first word line and a second word line, located between the first bit line and the second bit line; a source line, located between the first word line and the second word line; a channel pillar, penetrating through the first word line, the source line and the second word line, and connected to the first bit line, the source line, and the second bit line; a first charge storage structure, surrounding a top surface and a bottom surface of the first word line, and sandwiched between a sidewall of the first word line and a lower portion of a sidewall of the channel pillar; and a second charge storage structure, surrounding a top surface and a bottom surface of the second word line, and sandwiched between a sidewall of the second word line and an upper portion of the sidewall of the channel pillar. The first word line, the first charge storage structure, and the channel pillar form a first memory cell; the second word line, the second charge storage structure, and the channel pillar, the second bit line form a second memory cell.

An embodiment of the invention further provides a method of fabricating a memory device including: forming a first bit line on a dielectric layer; and performing at least one cycle process. The at least one cycle process includes following steps. A first stacked structure, a conductive layer and a second stacked structure are formed on the first bit line and the dielectric layer, wherein the first stacked structure and the second stack structure respectively include a first insulating layer, a sacrificial layer and a second insulating layer from bottom to top, and the conductive layer serves as a source line. A hole is formed through the second stacked structure, the conductive layer, and the first stacked structure. A channel pillar is formed in the hole, and the channel pillar is connected to the first bit line. A recess slit is formed in the second stacked structure, the conductive layer and at least a part of the first stacked structure. The sacrificial layers of the second stacked structure and the first stacked structure exposed by the recess slit are removed to form a first word line trench and a second word line trench. The first word line trench and the second word line trench expose a sidewall of the channel pillar. A first charge storage structure is formed to cover a top surface and a bottom surface of the first word line trench and the sidewall of the channel pillar, and a second charge storage structure is formed to cover a top surface and bottom surface of the second word line trench and the sidewall of the channel pillar. A first word line is formed in the first word line trench, and a second word line is formed in the second word line trench. An insulating material is filled in the recess slit. A second bit line is formed above the second stacked structure, and the second bit line is electrically connected to the channel pillar. The first word line, the first charge storage structure, and the channel pillar form a first memory cell; and the second word line, the second charge storage structure, and the channel pillar, form a second memory cell.

The 3D memory device of the invention includes a plurality of memory cells stacked vertically in a cell area, so as to effectively utilize the area of the substrate. In addition, the fabrication process of the 3D memory device of the invention may be compatible with the existing fabrication process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 3A to FIG. 3J are schematic cross-sectional views of a fabrication process of a memory device according to an embodiment of the invention.

DESCRIPTION OF THE EMBODIMENTS

Figure 1A:
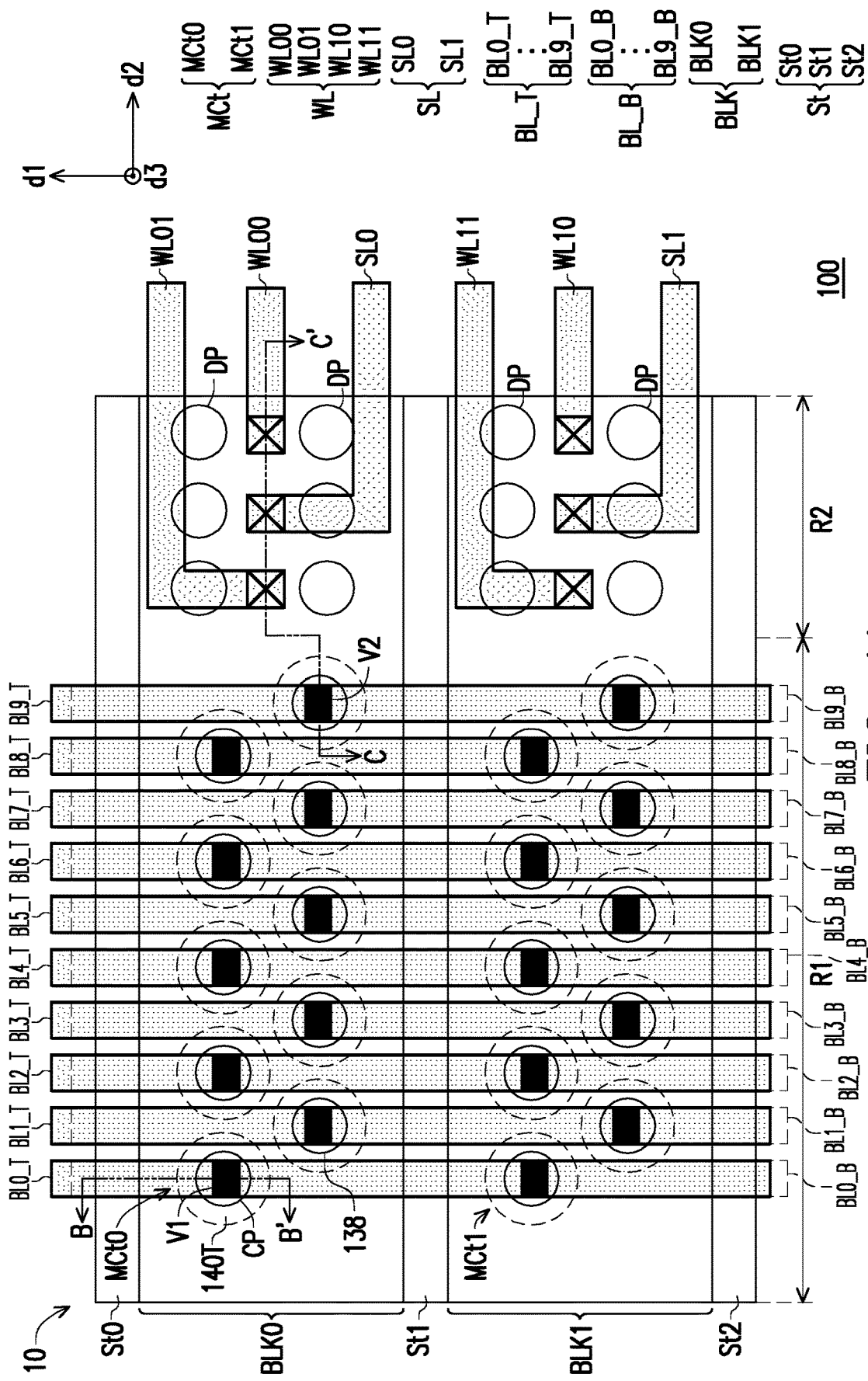
FIG. 1A is a top view of a memory device according to an embodiment of the invention.

Referring to FIG. 1A, a memory device 10 of an embodiment of the invention is a three-dimensional (3D) NOR flash memory device, which is disposed on a substrate 100. The substrate 100 includes a plurality of blocks BLK separated by a plurality of insulating silts St. In FIG. 1A, the blocks BLK are represented by two blocks BLK0 and BLK1, but the invention is not limited thereto. The block BLK0 and the block BLK1 are separated by insulating silts (or referred to as insulating slits) St0, St1 and St2. The memory device 10 includes a plurality of memory cell groups MCt located in a first region R1 of each of the blocks BLK. The first region R1 may also be referred to as a memory cell region. The memory cell groups MCt in each of the blocks BLK may be respectively arranged in an array formed by a plurality of columns and a plurality of rows. The memory cell groups MCt of two adjacent rows may be aligned or staggered. For example, the memory cell groups MCt0 in the block BLK0 are arranged in an array formed by a plurality of columns and a plurality of rows, and the memory cell groups MCt0 of two adjacent rows may be staggered with each other (as that shown in FIG. 1A) or aligned with each other (not shown). The memory cell groups MCt1 in the block BLK1 are also arranged in an array formed by a plurality of columns and a plurality of rows, and the memory cell groups MCt1 of two adjacent rows may be staggered with each other (as that shown in FIG. 1A) or aligned with each other (not shown). Moreover, the memory cell groups MCt0 of the odd-numbered rows in the block BLK0 and the memory cell groups MCt1 of the odd-numbered rows in the block BLK1 are aligned with each other in a first direction d1. The memory cell groups MCt0 of the even-numbered rows in the block BLK0 and the memory cell groups MCt1 of the even-numbered rows in the block BLK1 are aligned with each other in the first direction d1.

Figures 1B, 1C:
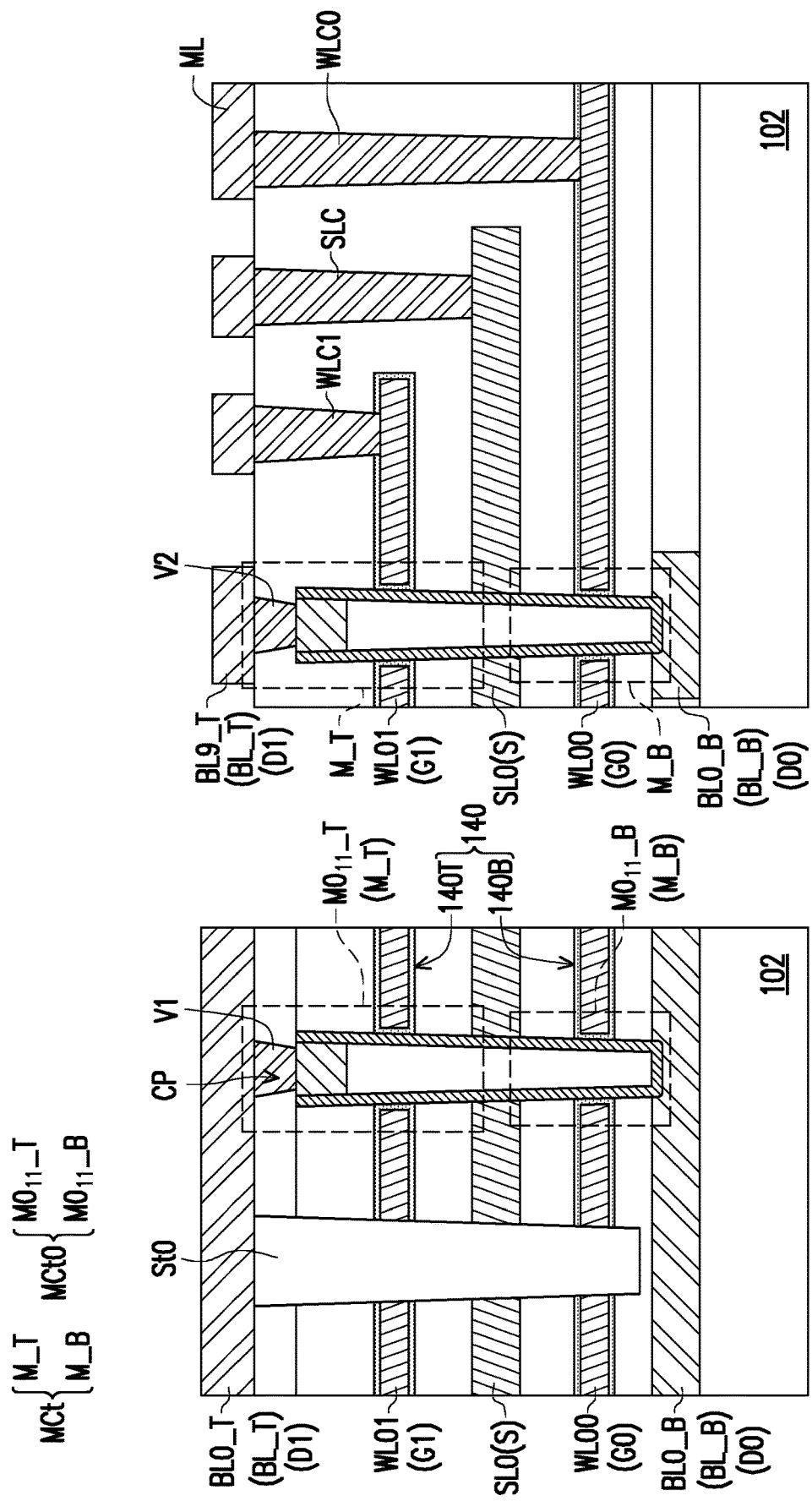
FIG. 1B is a cross-sectional view of FIG. 1A along a line B-B'.
FIG. 1C is a cross-sectional view of FIG. 1A along a line C-C'.

Referring to FIG. 1B, each of the memory cell groups MCt includes first memory cell M_B and second memory cell M_T stacked in a third direction d3. For example, in FIG. 2, the block BLK0 has first memory cells $M0_{11}\_B$, $M0_{12}\_B$ and $M0_{13}\_B$ and second memory cells $M0_{11}\_T$, $M0_{12}\_T$ and $M0_{13}\_T$. The second memory cells $M0_{11}\_T$, $M0_{12}\_T$ and $M0_{13}\_T$ are respectively disposed on top of the first memory cells $M0_{11}\_B$, $M0_{12}\_B$ and $M0_{13}\_B$, and respectively form one memory cell set MCt0. Similarly, the block BLK1 has first memory cells $M1_{11}\_B$, $M1_{12}\_B$ and $M1_{13}\_B$ and second memory cells $M1_{11}\_T$, $M1_{12}\_T$ and $M1_{13}\_T$. The second memory cells $M1_{11}\_T$, $M1_{12}\_T$ and $M1_{13}\_T$ are respectively disposed on top of the first memory cells $M1_{11}\_B$, $M1_{12}\_B$ and $M1_{13}\_B$, and respectively form one memory cell set MCt1.

Figure 2:
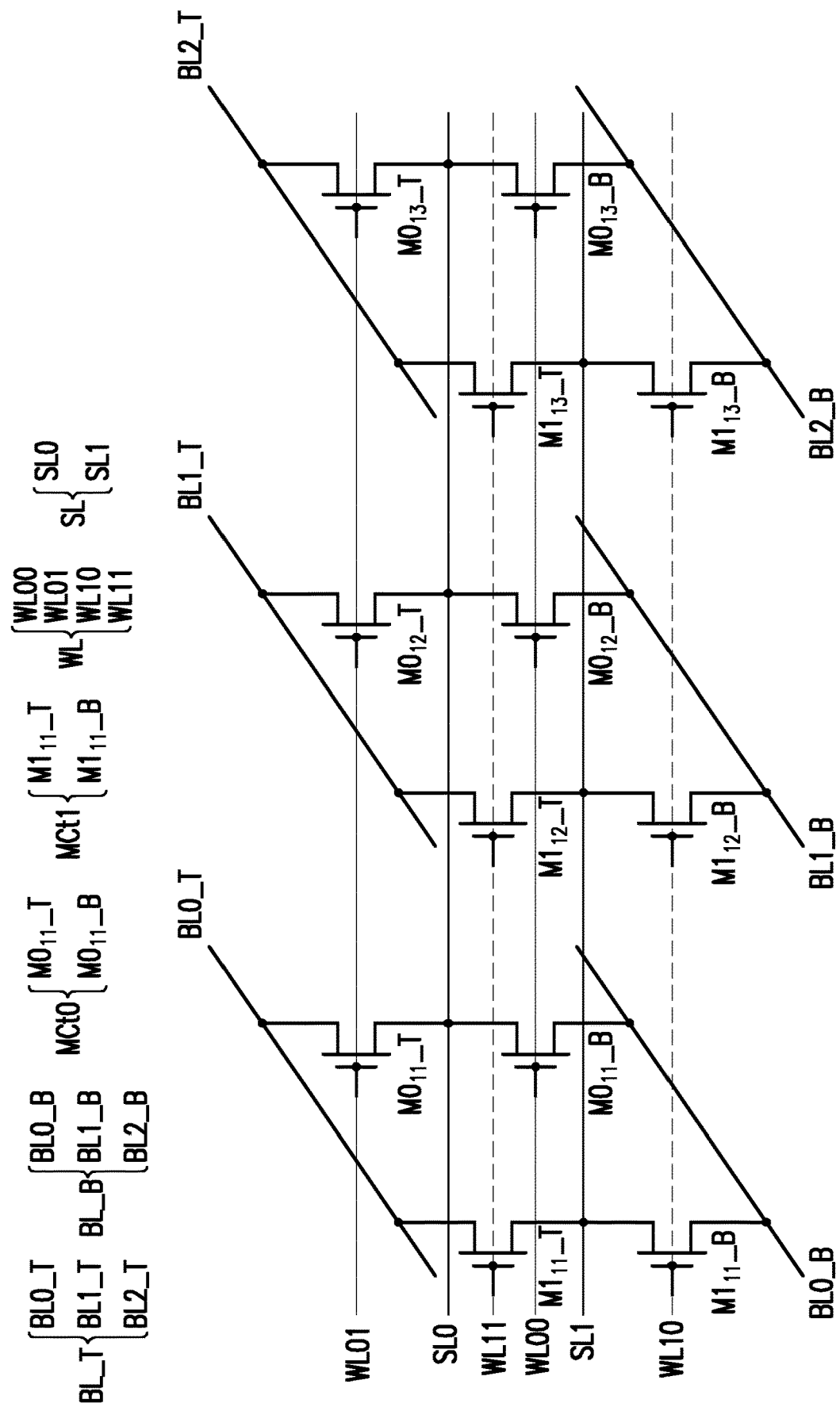
FIG. 2 is a partial equivalent circuit diagram of FIG. 1A.

Referring to FIG. 1A and FIG. 2, the memory device 10 further includes a bit line BL_B and a bit line BL_T extending in the first direction d1. The bit line BL_T is correspondingly disposed above the bit line BL_B. The bit line BL_B, for example, includes bit lines BL0_B, BL1_B, . . . BL9_B, or more. The bit line BL_T, for example, includes bit lines BL0_T, BL1_T, . . . BL9_T, or more. Each bit line BL_B and each bit line BL_T may connect drains of the first memory cells and drains of the second memory cells in different blocks BLK in series. For example, a bit line BL0_B may connect the drain of the first memory cell $M0_{11}\_B$ in the block BLK0 and the drain of first memory cell $M1_{11}\_B$ in the block BLK1 in series. A bit line BL0_T may connect the drain of the second memory cell $M0_{11}\_T$ in the block BLK0 and the drain of the second memory cell $M1_{11}\_T$ in the block BLK1 in series.

Referring to FIG. 1A and FIG. 2, the memory device 10 further includes a plurality of source lines SL to connect common sources of a plurality of the first memory cells and a plurality of the second memory cells of a same row in a same block BLK. For example, the memory device 10 further includes source lines SL0 and SL1. The source line SL0 may connect a common source of the first memory cell $M0_{11}\_B$ and the second memory cell $M0_{11}\_T$, a common source of the first memory cell $M0_{12}\_B$ and the second memory cell $M0_{12}\_T$, and a common source of the first memory cell $M0_{13}\_B$ and the second memory cell $M0_{13}\_T$ in the block BLK0 in series. Similarly, a source line SL1 may connect a common source of the first memory cell $M1_{11}\_B$ and the second memory cell $M1_{11}\_T$, a common source of the first memory cell $M1_{12}\_B$ and the second memory cell $M1_{12}\_T$, and a common source of the first memory cell $M1_{13}\_B$ and the second memory cell $M1_{13}\_T$ in the block BLK1 in series.

Referring to FIG. 1A and FIG. 2, the memory device 10 further includes a plurality of word lines WL to connect gates of a plurality of the first memory cells of a same row or gates of a plurality of the second memory cells of a same row in a same block BLK. For example, a word line WL00 connects the gates of the first memory cells $M0_{11}\_B$, $M0_{12}\_B$ and $M0_{13}\_B$ of a same row (the first row) in the block BLK0. A word line WL01 connects the gates of the second memory cells $M0_{11}\_T$, $M0_{12}\_T$ and $M0_{13}\_T$ of a same row (the second row) in the block BLK0. A word line WL10 connects the gates of the first memory cells $M1_{11}\_B$, $M1_{12}\_B$ and $M1_{13}\_B$ of a same row (the first row) in the block BLK1. A word line WL11 connects the gates of the second memory cells $M1_{11}\_T$, $M1_{12}\_T$ and $M1_{13}\_T$ of a same row (the second row) in the block BLK1.

Referring to FIG. 1B, in the embodiment, the memory cell set MCt0 in the block BLK0 includes the first memory cell $M0_{11}\_B$ and the second memory cell $M0_{11}\_T$. The first memory cell $M0_{11}\_B$ includes a gate G0 (i.e., the word line WL00), a charge storage structure 140B, a channel pillar CP, the bit line BL0_B (a drain D0), and the source line SL0 (a source S, or referred to as a common source). The second memory cell $M0_{11}\_T$ is disposed above the first memory cell $M0_{11}\_B$. The second memory cell $M0_{11}\_T$ includes a gate G1 (i.e., the word line WL01), a charge storage structure 140T, the channel pillar CP, the bit line BL0_T (a drain D0, and the source line SL0 (the source S, or referred to as the common source). The gate G0 and the gate G1 are disposed between the bit line BL0_B (the drain D0) and the bit line BL0_T (the drain D1).

The charge storage structure 140B and the charge storage structure 140T are separated from each other and form a charge storage structure 140. The charge storage structure 140T is located above the charge storage structure 140B. The charge storage structure 140B covers and physically contacts a top surface and a bottom surface of the gate electrode G0, and is sandwiched between and in contact with a sidewall of the gate electrode G0 and a lower portion of an outer sidewall of the channel pillar CP. The charge storage structure 140T covers and physically contacts a top surface and a bottom surface of the gate G1, and is sandwiched between and in contact with the sidewall of the gate G1 and an upper portion of the outer sidewall of the channel pillar CP. The source line SL0 (the source S) is disposed between the gate G0 and the gate G1. The source line SL0 (the source S) is a continuous layer and is in physical contact with a middle portion of the outer sidewall of the channel pillar CP. The bit line BL0_B (the drain D0) is in physical contact with a bottom surface of the channel pillar CP. The bit line BL0_T (the drain D1) is electrically connected to a top surface of the channel pillar CP through a via V1.

Referring to FIG. 1A and FIG. 1C, an end of the word line WL00 is connected to a metal layer ML through a word line contact WLC0. An end of the word line WL01 is connected to the metal layer ML through a word line contact WLC1. An end of the source line SL0 is connected to the metal layer ML through a source line contact SLC. The end of the word line WL00, the end of the source line SL0, and the end of the word line WL01 are disposed in a second region R2 of the block BLK0. The end of the word line WL00, the end of the source line SL0, and the end of the word line WL01 may present a stepped shape, and the second region R2 may also be referred to as a staircase region.

Referring to FIG. 1A and FIG. 1B, in some embodiments, the second region R2 may further include a plurality of dummy pillars DP. The dummy pillars DP are used to provide support to the structure during a fabrication process to avoid collapse of layers or the structure. The dummy pillars DP may be formed at a same time when memory holes (or referred to as channel holes) and the channel pillar CP are formed. A structure of the dummy pillar DP may be the same as the structure of the channel pillar CP, but a size thereof may be the same as or similar to that of the memory hole (or the channel hole). Regarding the channel pillar CP and the dummy pillars DP disposed in the block BLK0, the bit line BL0_B is located under the channel pillar CP, and the channel pillar CP is electrically connected to the bit line BL0_B, while the bit line BL0_B is not located under the dummy pillar DP, and the dummy pillar DP is not electrically connected to the bit line BL0_B. A via, for example, the via V1 is formed above the channel pillar CP to electrically connect the bit line BL0_T, while no via is formed above the dummy pillar DP, and the dummy pillar DP and the bit line BL0_T are not electrically connected. The gate G0, the source line SL0, the gate G1, or the charge storage structure 140 are located around and in contact with a sidewall of the dummy pillar DP.

Figure 3B:
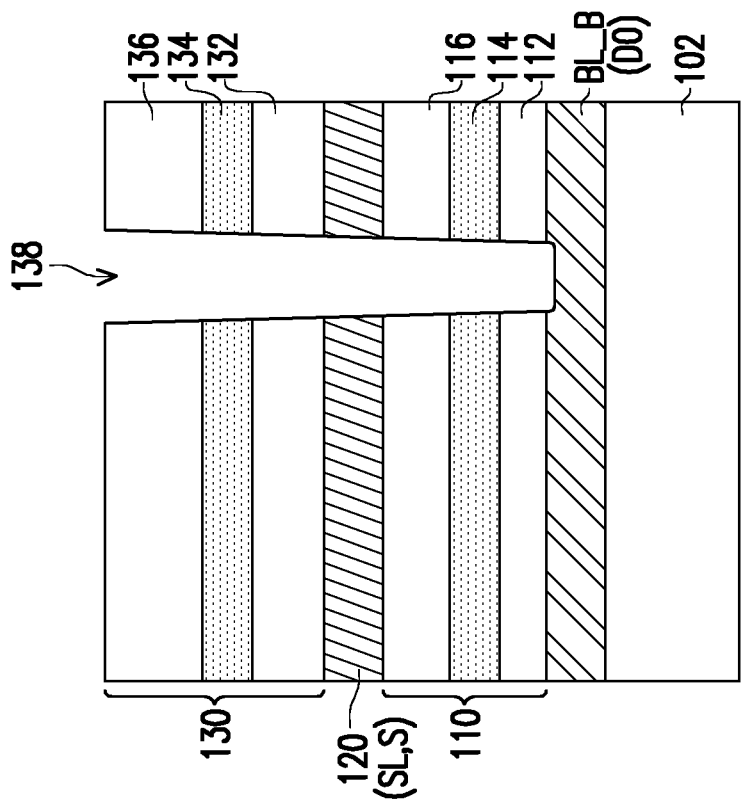
Figure 3A:
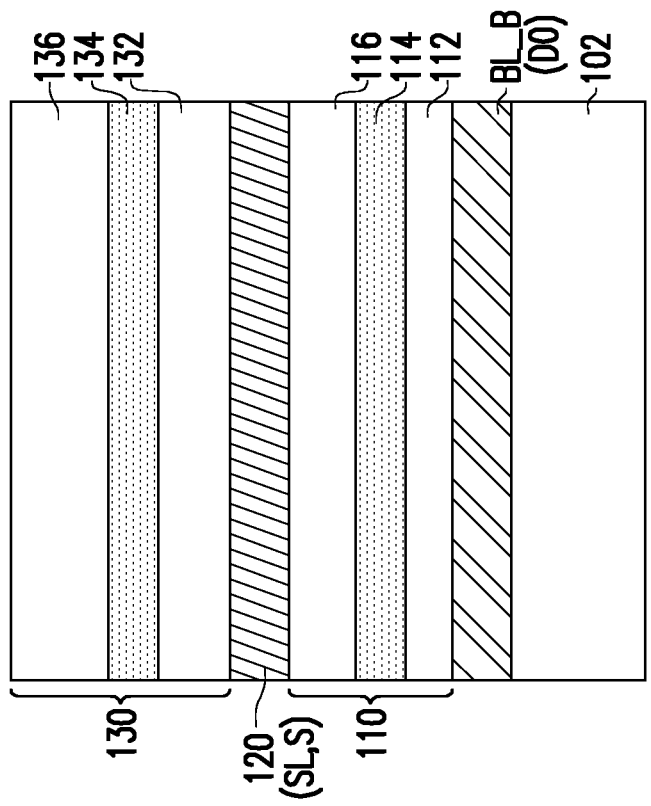

Referring to FIG. 3A, a fabrication method of the memory device 10 (shown in FIG. 1A) of the embodiment of the invention is as follows. The manufacturing process of the following embodiments is illustrated by forming a single memory cell set MCt. However, a plurality of memory cell sets MCts may be formed by the manufacturing process described below. First, a substrate (not shown) is provided. The substrate includes a semiconductor substrate, for example, a silicon substrate. A dielectric layer 102 is formed on the substrate. A material of the dielectric layer 102 is, for example, silicon oxide formed through chemical vapor deposition. A bit lines BL_B are formed on the dielectric layer 102. The bit line BL_B may also be referred to as a drain (D0). In some embodiments, a method of forming the bit lines BL_B is, for example, to use chemical vapor deposition to form doped polysilicon, and then perform patterning by using a lithography and etching process. Thereafter, another dielectric layer (not shown) is formed, and then a planarization process, such as a chemical polishing process, is performed to remove the another dielectric layer on the bit lines BL_B. In alternative embodiments, the another dielectric layer (not shown) is formed before forming the bit lines BL_B, and then the another dielectric layer is patterned to form bit line trenches. Thereafter, a doped polysilicon layer is formed on the another dielectric layer and fills in the bit line trenches, and then a planarization process, such as a chemical polishing process, is performed to remove the doped polysilicon layer on the another dielectric layer so as to form the bit lines BL_B.

Then, a first stacked structure 110, a conductive layer 120 and a second stacked structure 130 are formed on the bit lines BL_B and the dielectric layer 102. The first stacked structure 110 includes a first insulating layer 112, a sacrificial layer 114 and a second insulating layer 116 stacked from bottom to top. A material of the first insulating layer 112 and the second insulating layer 116 is, for example, silicon oxide formed through chemical vapor deposition. A material of the sacrificial layer 114 is different from the material of the first insulating layer 112 and the second insulating layer 116, and is, for example, silicon nitride formed through chemical vapor deposition. Thicknesses of the first insulating layer 112, the sacrificial layer 114 and the second insulating layer 116 may be the same or different.

The conductive layer 120 is, for example, a doped polysilicon layer formed through chemical vapor deposition. The conductive layer 120 serves as the source line SL (the source S). The second stacked structure 130 includes a first insulating layer 132, a sacrificial layer 134 and a second insulating layer 136 stacked from bottom to top. A material of the first insulating layer 132 and the second insulating layer 136 is, for example, silicon oxide formed through chemical vapor deposition. A material of the sacrificial layer 134 is different from the material of the first insulating layer 132 and the second insulating layer 136, and is, for example, silicon nitride formed through chemical vapor deposition. Thicknesses of the first insulating layer 132, the sacrificial layer 134 and the second insulating layer 136 may be the same or different. For example, the thickness of the second insulating layer 136 may be greater than the thicknesses of the first insulating layer 132 and the sacrificial layer 134.

Referring to FIG. 3B, a patterning process is performed through a lithography and etching process to form a hole 138 in the second stacked structure 130, the conductive layer 120 and the first stacked structure 110. The hole 138 may also be referred to as a memory hole or a channel hole. The hole 138 exposes the bit line BL_B. Viewing from the top view shown in FIG. 1A, a shape of the hole 138 may be a circle, an oval, etc. In some embodiments, a plurality of holes (not shown) are also formed in the second stacked structure 130, the conductive layer 120 and the first stacked structure 110 in the staircase region (not shown) of the substrate, and no bit line BL_B is located below the holes. These holes are used to form the dummy pillars (as shown in FIG. 1A) to support the structure of the semiconductor device in subsequent processes to avoid collapse of layers or the structure.

Figure 3C:
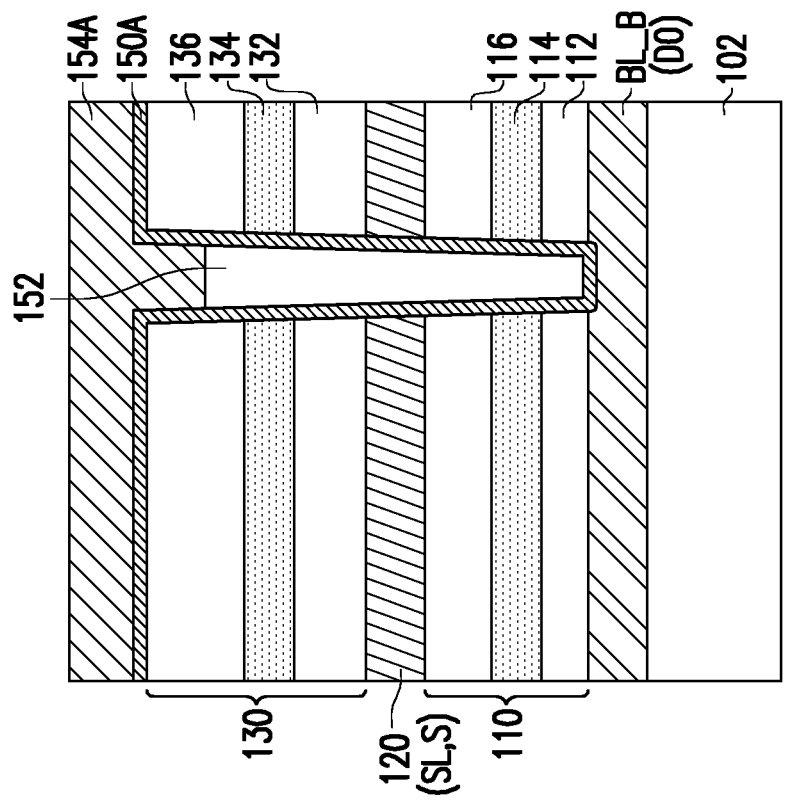
Figure 3D:
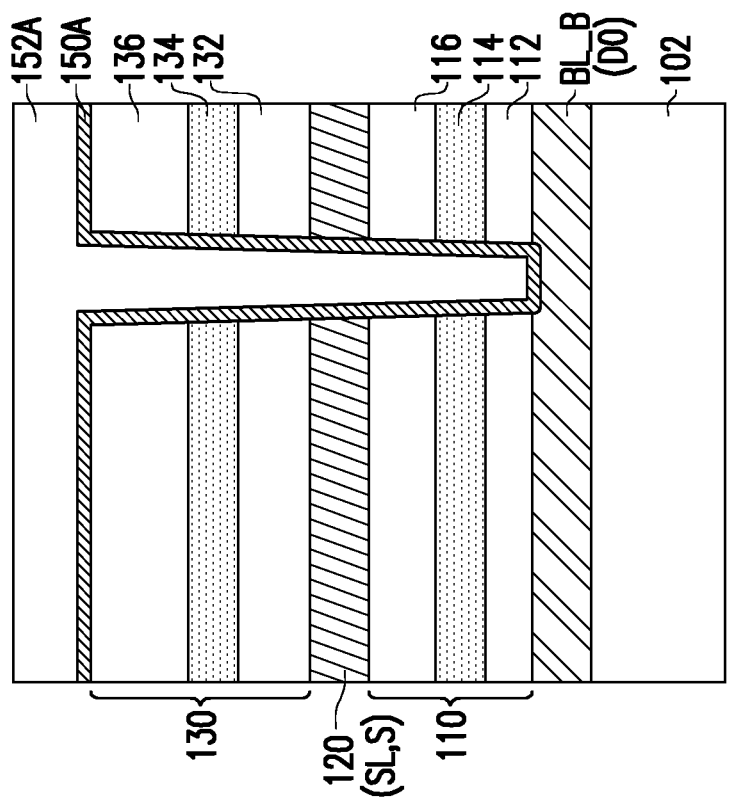

Referring to FIGS. 3C to 3E, a process of forming a channel pillar CP in the hole 138 is performed. In some embodiments, a method for forming the channel pillar CP includes following steps. First, a channel layer 150A and an insulating material 152A are formed on the third stacked structure 130 and in the hole 138, as shown in FIG. 3C. The channel layer 150A conformally covers the second stacked structure 130, a sidewall of the hole 138, and a top surface of the bit line BL_B, and is electrically connected to the bit line BL_B. The channel layer 150A includes a doped semiconductor material, an undoped semiconductor material, or a combination thereof. For example, the channel layer 150A may be formed by first performing a chemical vapor deposition process or a physical vapor deposition process to form an undoped polysilicon layer, and then performing an annealing process to complete fabricating the channel layer 150A. The insulating material 152A covers the channel layer 150A and fills the hole 138. The insulating material 152A is, for example, silicon oxide, silicon nitride, silicon oxynitride, other suitable dielectric materials or a combination thereof formed through chemical vapor deposition.

Referring to FIG. 3D, a part of the insulating material 152A is removed to form an insulating core 152 in the hole 138. The removal process may be a single-stage etching process, a two-stage etching process, a multi-stage etching process, a chemical mechanical polishing process, or a combination thereof. The etching process may be, for example, anisotropic etching, isotropic etching, or a combination thereof. A top surface of the insulating core 152 is lower than the top surface of the second stacked structure 130, and therefore, a groove (not shown) is formed on the top surface of the insulating core 152. Then, a conductive layer 154A is formed on the top surface of the second stacked structure 130 and in the groove above the insulating core 152. The conductive layer 154A is, for example, doped polysilicon, tungsten, platinum, or a combination thereof formed through a chemical vapor deposition process or a physical vapor deposition process.

Referring to FIG. 3E, an etch-back process or a chemical mechanical polishing process is performed to remove the conductive layer 154A on the top surface of the second stacked structure 130 to form a conductive plug 154 in the groove, and fabrication of the channel pillar CP is completed. The channel pillar CP includes the insulating core 152, the conductive plug 154 and the channel layer 150. The insulating core 152 is located in the hole 138. The conductive plug 154 is located on the insulating core 152, and is electrically connected to the channel layer 150. The channel layer 150 is a conformal layer that surrounds sidewalls of the insulating core 152 and the conductive plug 154, and wraps the bottom of the insulating core 152, and is electrically connected to the conductive plug 154, the bit line BL_B and the conductive layer 120. The conductive layer 120 serves as a source line SL or a source S. In some embodiments, structures similar to the insulating core 152, the conductive plug 154, and the channel layer 150 are also formed in the plurality of holes (not shown) in the staircase region of the substrate to form the dummy pillars. No bit line BL_B is disposed under the dummy pillars, and the dummy pillars are not electrically connected to the bit line BL_B.

Referring to FIG. 3F, a stop layer 162 is formed on the second stacked structure 130. A material of the stop layer 162 includes silicon oxide, silicon nitride, silicon oxynitride, silicon carbide, or a combination thereof formed by chemical vapor deposition (CVD). In some embodiments, the stop layer 162 includes a material different from the material of the topmost second insulating layer 136. Then, a recess slit 164 is formed in the stop layer 162, the second stacked structure 130, and the conductive layer 120 and the first stacked structure 110. In some examples, the recess slit 164 at least extends through the sacrificial layer 114 in depth to expose the first insulating layer 112 at the bottom of the recess slit 164.

Referring to FIG. 3F, an etching process is performed to remove the sacrificial layers 114 and 134 to form gate trenches 172 and 174. The etching method may be dry etching, wet etching, or a combination thereof. In the embodiment where the sacrificial layers 114 and 134 are silicon nitride, phosphoric acid may be used as an etchant. During this stage of the fabrication process, the dummy pillars in the staircase region of the substrate may provide structural support in the process to avoid collapse of layers or the structure.

Figure 3H:
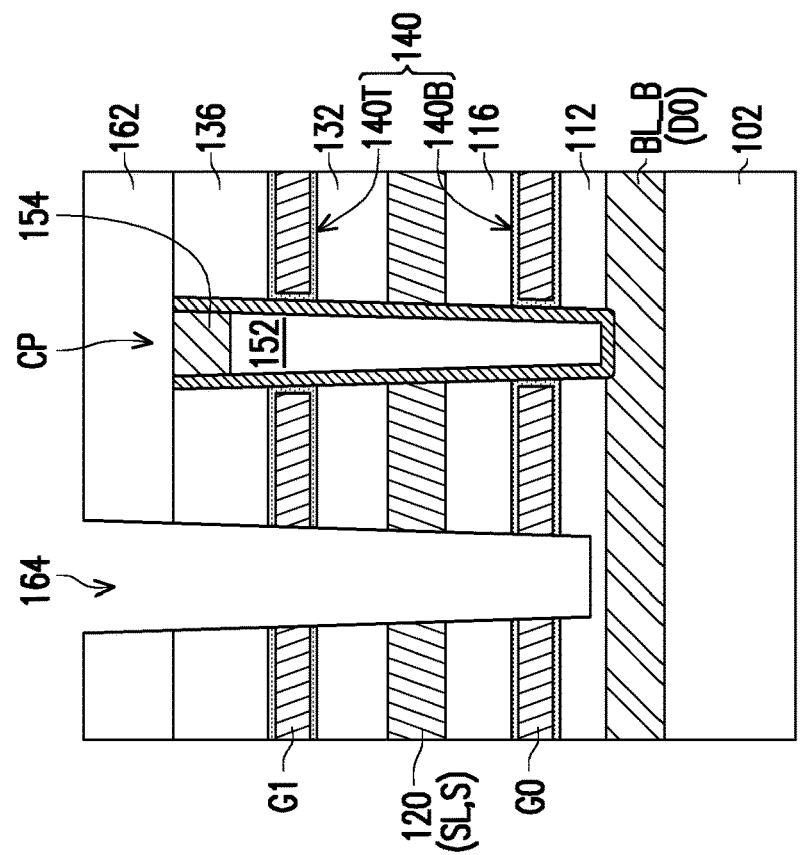
Figure 3G:
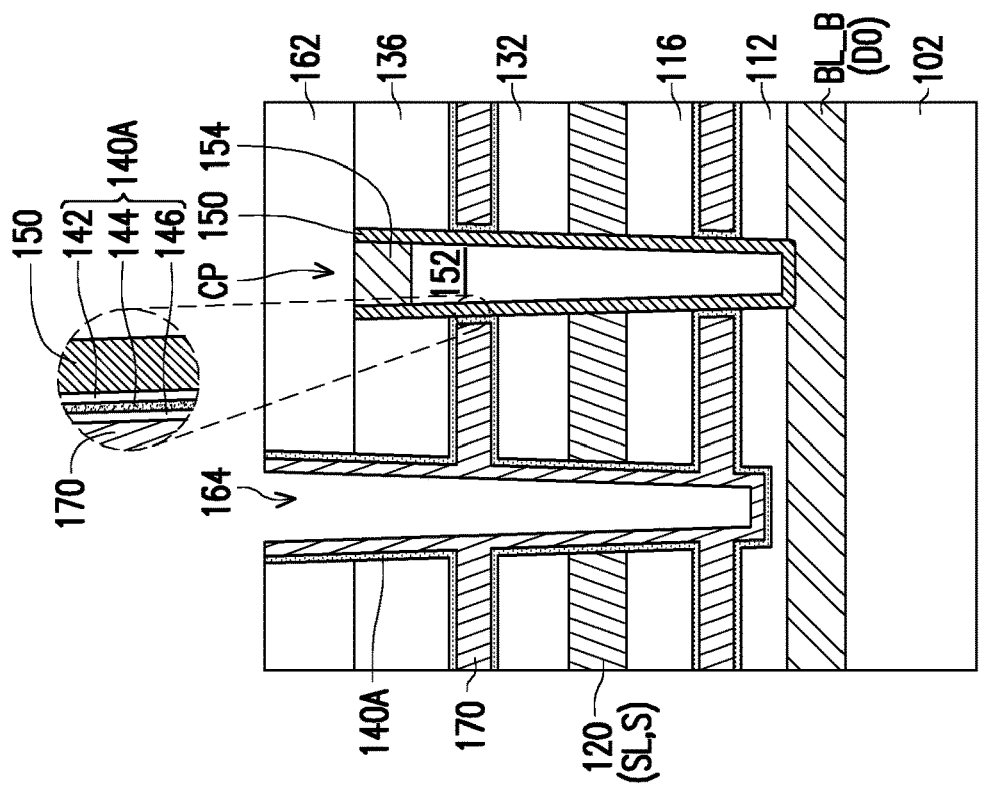

Referring to FIG. 3G, a charge storage structure 140A and a conductive layer 170 are formed on exposed surfaces of the gate trenches 172 and 174 and a sidewall of the recess slit 164. In an embodiment, the charge storage structure 140A may include a tunneling layer 142, a charge storage layer 144 and a blocking layer 146. The tunneling layer 142/the charge storage layer 144/the blocking layer 146 is, for example, a composite layer of oxide/nitride/oxide (ONO), or a composite layer formed by other materials. The charge storage structure 140A may also be, for example, a composite layer of oxide/nitride/oxide/nitride/oxide (ON-ONO), a composite layer of silicon/oxide/nitride/oxide/silicon (SONOS), aluminium oxide/oxide/nitride/oxide ($Al_2O_3$/O/N/O) or other suitable composite layers. The charge storage structure 140A may be formed by processes such as chemical vapor deposition, thermal oxidation, nitridation, etching, etc. The method of forming the conductive layer 170 is, for example, to form a conductive material such as doped polysilicon, amorphous silicon, tungsten (W), cobalt (Co), aluminum (Al), tungsten silicide ($WSi_x$), or cobalt silicide ($CoSi_x$) through a chemical vapor deposition process or a physical vapor deposition process.

Referring to FIG. 3H, an anisotropic etching process is performed to remove the conductive layer 170 and the charge storage structure 140A covering the top surface of the stop layer 162 and filled in the recess slit 164 to form a charge storage structure 140 and gates G0 and G1. The charge storage structure 140 includes a charge storage structure 140B and a charge storage structure 140T that are separated from each other.

The charge storage structure 140B and the gate G0 are formed in the gate trench 172. The charge storage structure 140B covers the top surface and the bottom surface of the gate G0 and is sandwiched between the sidewall of the gate G0 and the lower portion of the outer sidewall of the channel pillar CP. The charge storage structure 140T and the gate G1 are formed in the gate trench 174. The charge storage structure 140T covers the top surface and the bottom surface of the gate G1 and is sandwiched between the sidewall of the gate G1 and the upper portion of the outer sidewall of the channel pillar CP.

Figure 3J:
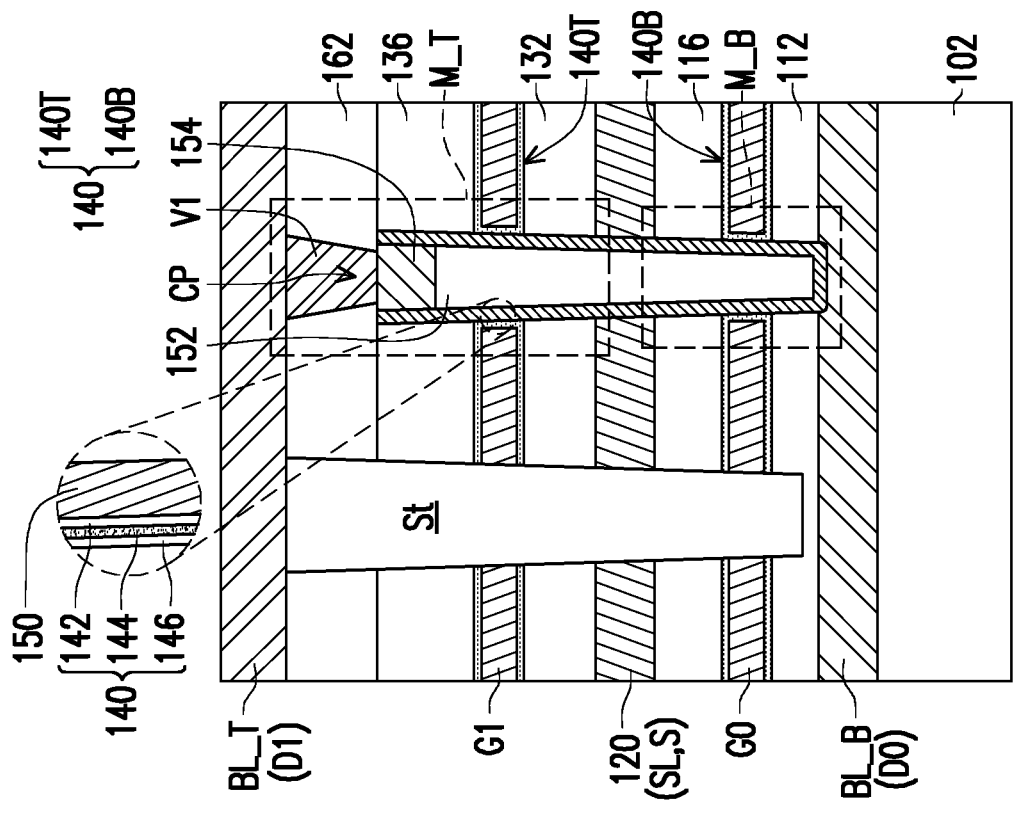
Figure 3I:
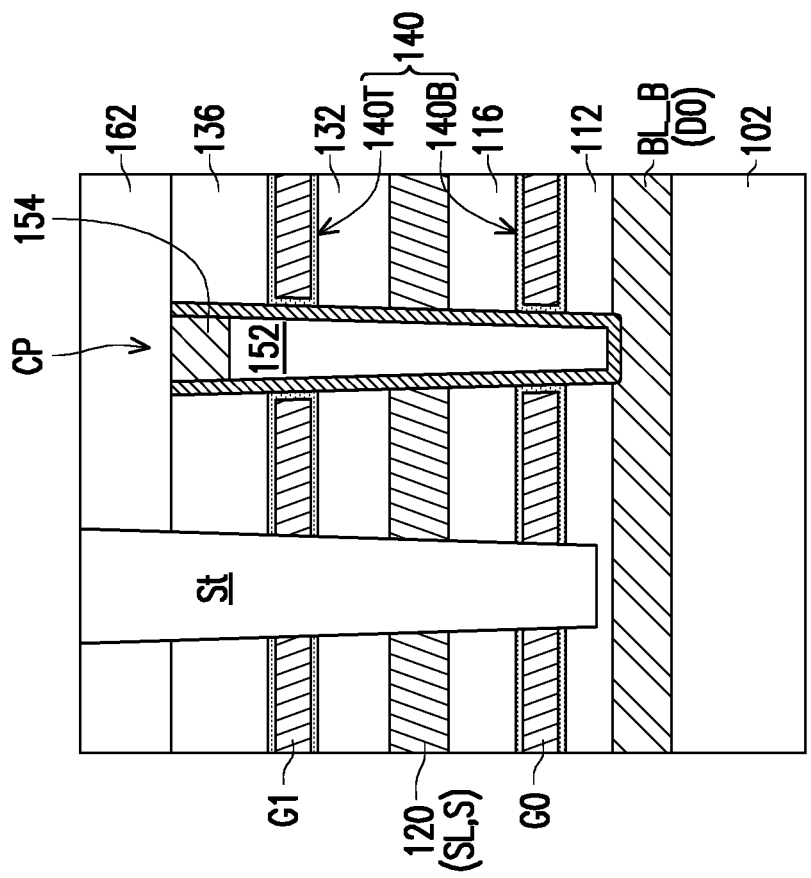

Referring to FIG. 3I, an insulating silt St is formed in the recess slit 164. A method for forming the insulating slit St is, for example, to form an insulating material layer such as silicon oxide or spin-on glass, etc., on the stop layer 162 by using a chemical vapor deposition method or a spin coating method. Thereafter, the stop layer 162 is used as a polishing stop layer or an etching stop layer to perform an etch-back process or a chemical mechanical polishing process to remove the insulating material layer on the stop layer 162.

Referring to FIG. 3J, a via V1 is formed in the stop layer 162. A method for forming the via V1 is, for example, to form a via hole in the stop layer 162 through a lithography and etching process. Then, a conductive material such as doped polysilicon, amorphous silicon, tungsten (W), cobalt (Co), aluminum (Al), tungsten silicide ($WSi_x$), or cobalt silicide ($CoSi_x$) is formed on the stop layer 162 through a chemical vapor deposition process or a physical vapor deposition process. Thereafter, an etch-back process or a chemical mechanical polishing process is performed to remove the conductive material covering the surface of the stop layer 162.

Thereafter, a bit line BL_T (a drain D0 are formed on the stop layer 162. A method of forming the bit line BL_T is, for example, to form doped polysilicon by using a chemical vapor deposition process, and then perform patterning by using a lithography and etching process. The bit line BL_T are electrically connected to the channel pillar CP through the via V1.

The gate G0, the charge storage structure 140B, a lower portion of the channel pillar CP, the drain D0 and the source S form a first memory cell M_B. The gate G1, the charge storage structure 140T, an upper portion of the channel pillar CP, the drain D1 and the source S form a second memory cell M_T. The second memory cell M_T is stacked on the first memory cell M_B. Moreover, the charge storage structure 140B and the charge storage structure 140T are separated from each other and are not in physical contact with the source S. The charge storage structure 140B and the source S are separated by the second insulating layer 116, and the charge storage structure 140T and the source S are separated by the first insulating layer 132.

Figure 4B:
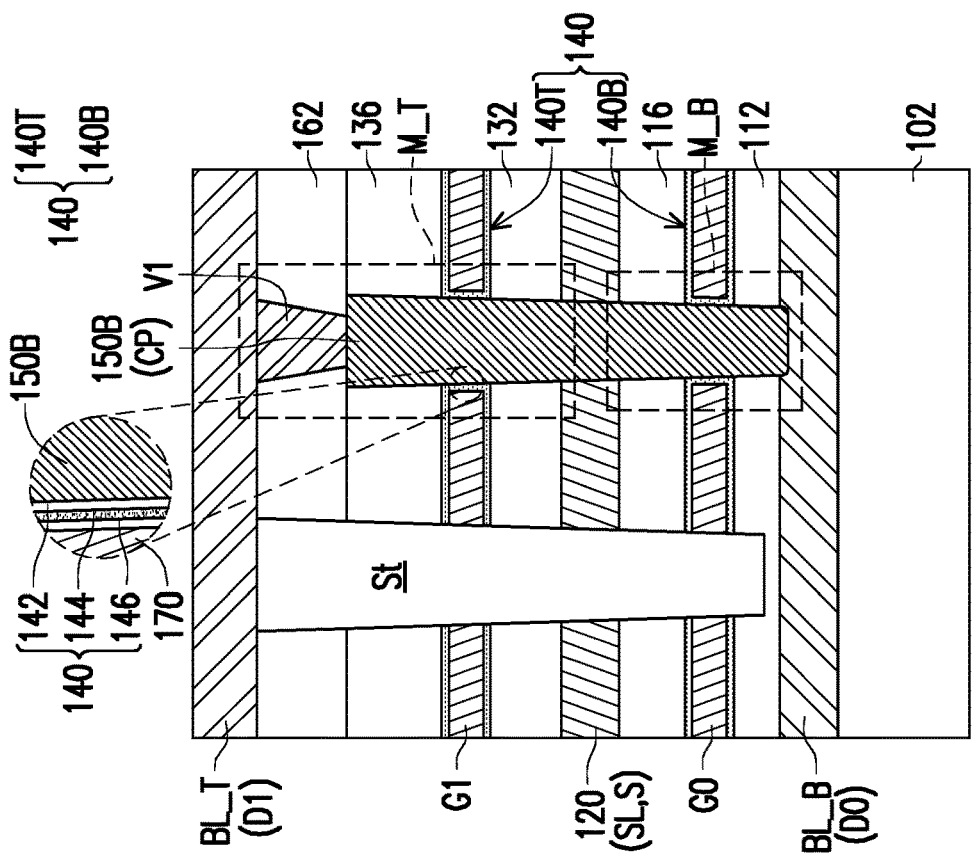
FIG. 4A to FIG. 4B are schematic cross-sectional views of a partial fabrication process of a memory device according to another embodiment of the invention.
Figure 4A:
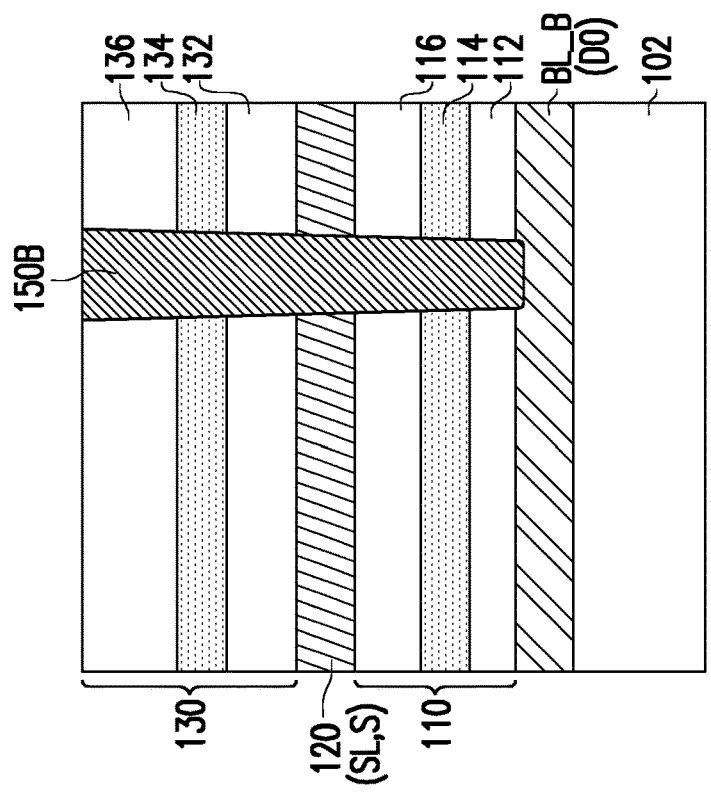

In the aforementioned embodiment, the channel pillar CP includes the insulating core 152, the conductive plug 154 and the channel layer 150. However, the embodiment of the invention is not limited thereto. In other embodiments, the channel pillar CP may also be composed of a solid doped semiconductor pillar 150B, as shown in FIGS. 4A and 4B. Referring to FIG. 3C and FIG. 4A, a method of forming the doped semiconductor pillar 150B is, for example, to form a doped semiconductor layer on the second stacked structure 130, and the doped semiconductor layer further fills the hole 138. The doped semiconductor layer is, for example, doped epitaxial silicon. Thereafter, an etch-back process or a chemical mechanical polishing process is performed to remove the conductive material covering the surface of the stop layer 162. A memory device using the solid doped semiconductor pillar 150B as the channel pillar CP is shown in FIG. 4B. Referring to FIG. 4B, the channel pillar CP is the solid doped semiconductor pillar 150B, which is in direct contact with and electrically connected to the bit line BL_B (the drain D0), and is in direct contact with the via V1 and is electrically connected to the bit line BL_T directly through the via V1 without using a conductive plug. A structure of the dummy pillars DP in the staircase region may be the same as a combined structure of the channel pillar CP, but a size thereof may be the same as or similar to that of the memory hole (or the channel hole).

Moreover, referring to FIG. 1A, in some embodiments, upper and lower sides of each channel pillar CP may be crossed by a single bit line BL_B and a single bit line BL_T. For example, the channel pillar CP of the memory cell set MCt0 is crossed by a single bit line BL0_B and a single bit line BL0_T. In some other embodiments, the upper and lower sides of each channel pillar CP may be crossed by two bit lines BL_T and two bit lines BL_B (not shown) under the two bit lines BL_T, as shown in FIG. 5.

Figure 5:
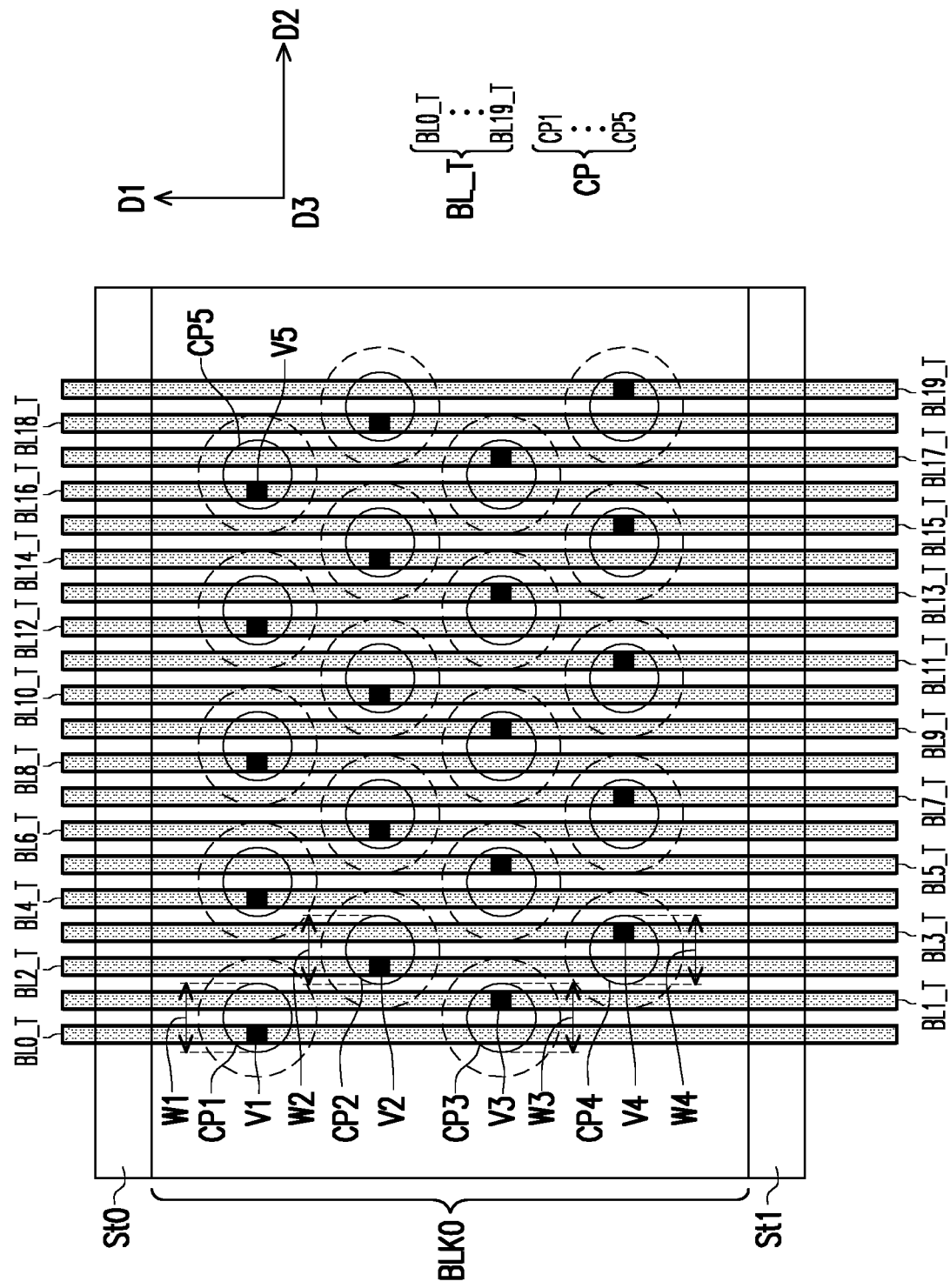
FIG. 5 is a top view of a memory device according to another embodiment of the invention.

Referring to FIG. 5, the memory device includes the bit line BL_B (not shown) and the bit line BL_T. The bit line BL_B includes bit lines BL0_B, BL1_B, . . . BL19_B (not shown). The bit line BL_T includes bit lines BL0_T, BL1_T, . . . BL19_T. The bit lines BL0_T and BL1_T cross the channel pillars CP1 and CP3 of a same column within a width W1 defined by the channel pillar (CP1) and a width W3 defined by the channel pillar (CP3) respectively. The bit line BL0T is electrically connected to the channel pillar CP1, and is not electrically connected to the channel pillar CP3. The bit line BL1_T is not electrically connected to the channel pillar CP1, but is electrically connected to the channel pillar CP3. The bit lines BL2_T and BL3_T cross the channel pillars CP2 and CP4 of a same column within a width W2 defined by the channel pillar (CP2) and a width W4 defined by the channel pillar (CP4) respectively. The bit line BL2_T is electrically connected to the channel pillar CP2, but is not electrically connected to the channel pillar CP4. The bit line BL3_T is not electrically connected to the channel pillar CP2, but is electrically connected to the channel pillar CP4. In other words, the vias (for example, V1 and V3) above the channel pillars CP (for example, CP1 and CP3) of the same column are misaligned in the first direction d1 without being aligned. The vias (for example, V1 and V5) above the channel pillars CP (for example, CP1 and CP5) of the same row may be aligned or misaligned in the second direction d2.

In some other embodiments, the memory device may also be made into a 3D memory device in a way of stacking.

Figure 6A:
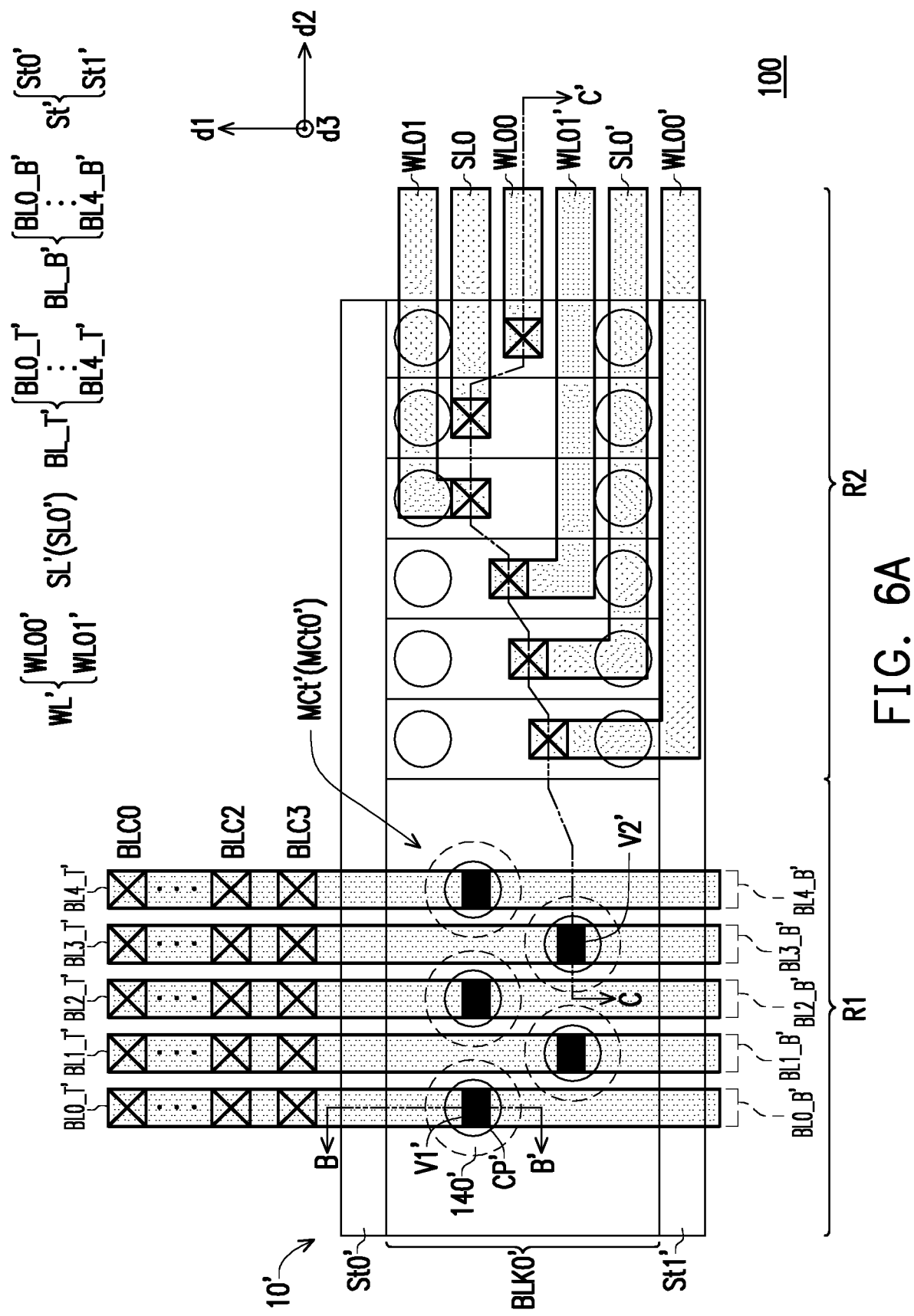
FIG. 6A is a top view of a 3D memory device according to an embodiment of the invention.
Figure 6B:
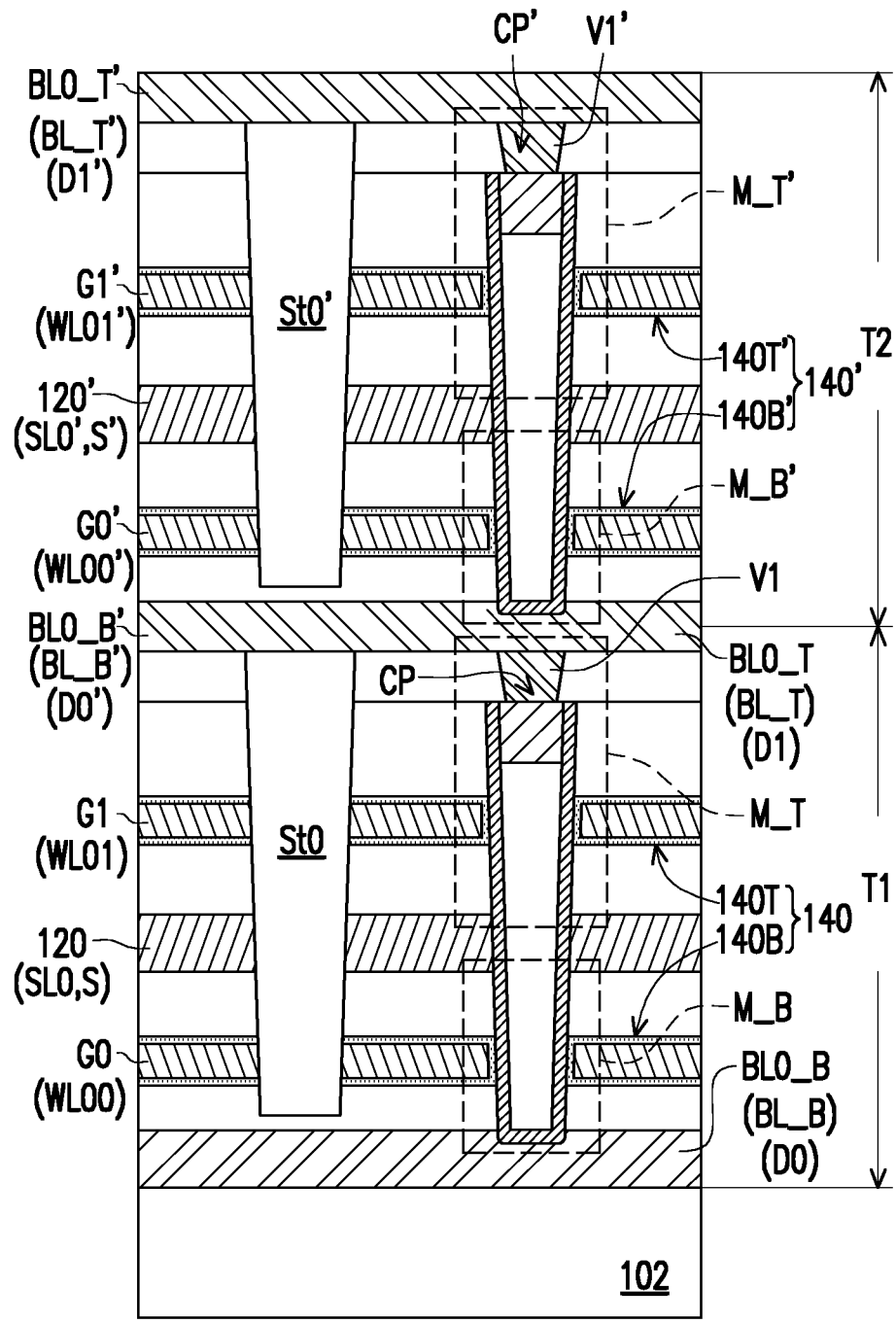
FIG. 6B is a cross-sectional view of FIG. 6A along a line B-B'.
Figure 6C:
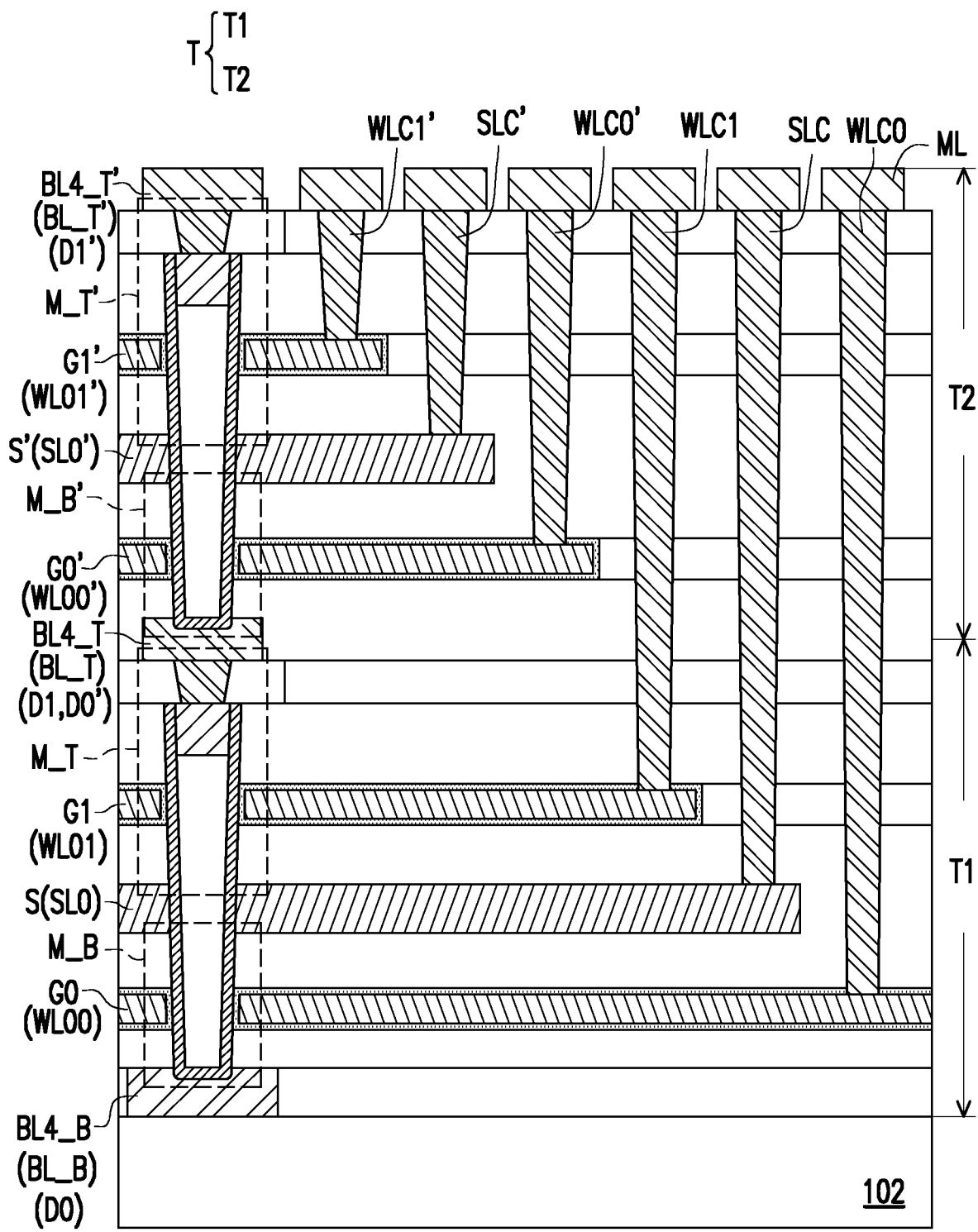
FIG. 6C is a cross-sectional view of FIG. 6A along a line C-C'.

Referring to FIGS. 6A, 6B and 6C, a 3D memory device 10' includes a plurality of tiers of semiconductor layers T. In FIGS. 7B and 7C, two tiers of semiconductor layers T1 and T2 are used for description. However, the invention is not limited thereto, and the 3D memory device 10' may include more tiers of semiconductor layers. For example, the 3D memory device 10' may include 2 to 12 tiers of semiconductor layers T. The semiconductor layer T1 and the aforementioned memory device 10 have similar structures. However, for simplicity's sake, only two insulating silts St' (for example, St0 and St1) and a single block BLK' (for example, BLK0') are illustrated in FIGS. 6A, 6B and 6C.

Referring to FIG. 6A and FIG. 6B, the semiconductor layer T2 and the semiconductor layer T1 have similar structures. In the semiconductor layer T2, a structure and arrangement of a plurality of memory cell sets MCt' (for example, MCt0') in each of a plurality of blocks BLK' (for example, BLK0') separated by a plurality of insulating silts St' (for example, St0' and St1') may be the same as or similar to the structure and arrangement of a plurality of the memory cell sets MCt in each block BLK. The semiconductor layer T2 includes a plurality of memory cell sets MCt'. Each of the memory cell sets MCt' includes a third memory cell M_B' and a fourth memory cell M_T' stacked in a third direction d3.

Referring to FIG. 6A, the semiconductor layer T2 further includes a plurality of bit lines BL_B' and a plurality of bit lines BL_T' extending in the first direction d1. The bit lines BL_B', for example, include bit lines BL0_B', BL1_B', BL2_B', BL3_B', and BL4_B', or more bit lines. The bit lines BL_T', for example, include bit lines BL0_T', BL1_T', BL2_T', BL3_T', and BL4_T', or more bit lines. Each bit line BL_B' of the semiconductor layer T2 is located on the bit line BL_T of the semiconductor layer T1, and each bit line BL_T' of the semiconductor layer T2 is located on the bit line BL_B'. Ends of the bit lines BL_B and BL_T of the semiconductor layer T1 and the bit lines BL_B' and BL_T' of the semiconductor layer T2 may present a stepped shape. The bit lines BL_B are connected to the metal layer ML through bit line contacts BLC0. In the embodiment, the bit lines BL_T and BL_B' may be shared and connected with the metal layer ML through bit line contacts BLC2. The bit lines BL_T' are connected to the metal layer ML through bit line contacts BLC3.

Referring to FIG. 6A and FIG. 6C, the semiconductor layer T2 further includes a word line WL00', a word line WL01', and a source line SL0' extending in the second direction d2. In the second region R2, an end of the word line WL00 of the semiconductor layer T1 is connected to the metal layer ML through the word line contact WLC0. An end of the word line WL01 is connected to the metal layer ML through the word line contact WLC1. An end of the source line SL0 is connected to the metal layer ML through the source line contact SLC. An end of the word line WL00' of the semiconductor layer T2 is connected to the metal layer ML through a word line contact WLC0'. An end of the word line WL01' is connected to the metal layer ML through a word line contact WLC1'. An end of the source line SL0' is connected to the metal layer ML through a source line contact SLC'.

The end of the word line WL00, the end of the source line SL0, the end of the word line WL01, the end of the word line WL00', the end of the source line SL0', and the end of the word line WL01' are disposed in the second region R2 of the block BLK0, and may present a stepped shape. Moreover, a plurality of dummy pillars DP' may also be included in the second region R2 to provide structural support during the fabrication process and avoid collapse of layers or structures. Structures of the dummy pillars DP' may be similar to that of the dummy pillars DP.

Figure 7:
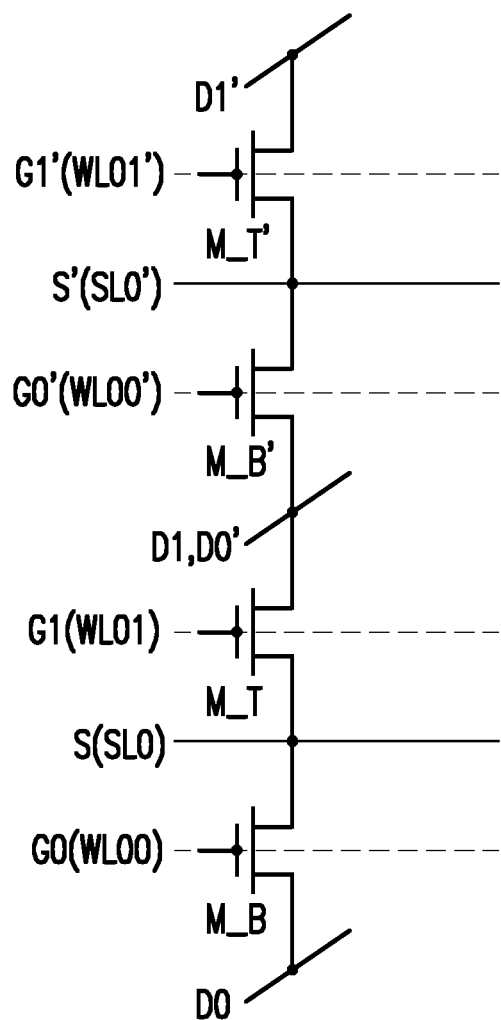
FIG. 7 is an equivalent circuit diagram of FIG. 6C.

FIG. 7 is an equivalent circuit diagram of FIG. 6C. Referring to FIG. 6C and FIG. 7, the memory cell M_B includes a gate G0, a source S, a drain D0, a charge storage structure 140B, and a channel pillar CP. The memory cell M_T includes a gate G1, the source S, a drain D1, a charge storage structure 140T and the channel pillar CP. The memory cell M_B' includes a gate G0', a source S', a drain D0', a charge storage structure 140B', and a channel pillar CP'. The memory cell M_T' includes a gate G1', the source S', a drain D1', a charge storage structure 140T' and the channel pillar CP'. The memory cell M_B' and the memory cell M_T' share the source S'. The drain D0' of the memory cell M_B' and the drain D1 of the memory cell M_T are shared. The charge storage structure 140B' and the charge storage structure 140T' are separated from each other, and are collectively referred to as a charge storage structure 140'.

In a method of fabricating the 3D memory device 10', the semiconductor device 10 may be formed according to the aforementioned method to complete the first semiconductor layer T1. Then, at least one cycle process is performed to form the second semiconductor layer T2. The at least one cycle process includes repeating the steps of forming the first stacked structure 110, the conductive layer 120, and the third stacked structure 130 in FIG. 3A to the step of forming a plurality of the bit lines BL_T of FIG. 3J, and/or according to FIG. 4A and FIG. 4B.

In summary, the NOR flash memory device of the invention includes two memory cells stacked vertically in a unit area, so as to effectively utilize the area of the substrate. The 3D NOR flash memory device may include a plurality of memory cells stacked vertically in the unit area, so as to effectively utilize the area of the substrate. In addition, the fabrication processes of the NOR flash memory device and the 3D NOR flash memory device of the invention may be compatible with the existing fabrication process.

What is claimed is:

1. A memory device, comprising:
at least one semiconductor layer, located above a dielectric layer, and the at least one semiconductor layer comprising:
a first bit line and a second bit line, wherein the first bit line is located on the dielectric layer, and the second bit line is located above the first bit line;
a first word line and a second word line, located between the first bit line and the second bit line;
a source line, located between the first word line and the second word line;
a channel pillar, penetrating through the first word line, the source line and the second word line, and connected to the first bit line, the source line, and the second bit line;
a first charge storage structure, surrounding a top surface and a bottom surface of the first word line, and sandwiched between a sidewall of the first word line and a lower portion of a sidewall of the channel pillar; and
a second charge storage structure, surrounding a top surface and a bottom surface of the second word line, and sandwiched between a sidewall of the second word line and an upper portion of the sidewall of the channel pillar,
wherein the first word line, the first charge storage structure and the channel pillar form a first memory cell; the second word line, the second charge storage structure and the channel pillar form a second memory cell.

2. The memory device of claim 1, further comprising a plurality of insulating silts, wherein the first bit line and the second bit line extend in a first direction, and cross the insulating silts extending in a second direction.

3. The memory device of claim 1, wherein the channel pillar comprises an insulating core, a conductive plug and a channel layer, and the channel layer surrounds sidewalls of the insulating core and the conductive plug and a bottom of the insulating core.

4. The memory device of claim 3, wherein the source line contacts a middle portion of the sidewall of the channel pillar.

5. The memory device of claim 1, wherein the source line is located between the first charge storage structure and the second charge storage structure, and is separated from the first charge storage structure and the second charge storage structure.

6. The memory device of claim 1, wherein the channel pillar is crossed by two of the first bit line and two of the second bit line, and the channel pillar is electrically connected to one of the two of the first bit line and one of the two of the second bit line, and is not electrically connected to the other one of the two of the first bit line and the other one of the two of the second bit line.

7. The memory device of claim 1, wherein the at least one semiconductor layer comprises 1 to 12 tiers.

8. The memory device of claim 1, wherein the at least one semiconductor layer comprises a first semiconductor layer and a second semiconductor layer over the first semiconductor layer, and a first bit line of the second semiconductor layer and the second bit line of the first semiconductor layer are shared.

9. The memory device of claim 1, further comprising a plurality of dummy pillars penetrating through the first word line, the source line and the second word line, and being not connected to the first bit line, and the second bit line.

10. The memory device of claim 1, further comprising a word line contact extending downward, penetrating through the second charge storage structure and contacting an end of a top surface of the second word line.

11. The memory device of claim 1, further comprising:
an another channel pillar arranged in a same column with the channel pillar; and
a third bit line arranged in parallel the second bit line, wherein the third bit line and the second bit line across over the channel pillar and the another channel pillar within a width defined by the channel pillar and within an another width defined by the another channel pillar respectively.

12. The memory device of claim 11, wherein the another channel pillar electrically connect to the third bit line, and the channel pillar electrically connect to the second bit line.

* * * * *